(12) United States Patent
Wang

(10) Patent No.: US 11,335,882 B2
(45) Date of Patent: May 17, 2022

(54) ORGANIC LIGHT-EMITTING DIODE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD, Wuhan (CN)

(72) Inventor: Kun Wang, Wuhan (CN)

( * ) Notice: Subject to any disclaimer, the term of this patent is extended or adjusted under 35 U.S.C. 154(b) by 32 days.

(21) Appl. No.: 16/641,655

(22) PCT Filed: Nov. 15, 2019

(86) PCT No.: PCT/CN2019/118707
§ 371 (c)(1),
(2) Date: Feb. 25, 2020

(87) PCT Pub. No.: WO2021/035986
PCT Pub. Date: Mar. 4, 2021

(65) Prior Publication Data
US 2021/0074949 A1    Mar. 11, 2021

(30) Foreign Application Priority Data
Aug. 28, 2019 (CN) .......................... 201910803113.8

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/5338* (2013.01)

(58) Field of Classification Search
CPC ... H01L 51/5253; H01L 51/56; H01L 51/525; H01L 27/3246; H01L 27/3258; H01L 2251/5338
See application file for complete search history.

(56) References Cited

U.S. PATENT DOCUMENTS

| 2014/0326965 A1* | 11/2014 | Cho ..................... H01L 27/3279 257/40 |
| 2015/0303406 A1* | 10/2015 | Kim .................... H01L 51/5256 257/40 |
| 2018/0046221 A1* | 2/2018 | Choi .................. G02B 26/0825 |

(Continued)

FOREIGN PATENT DOCUMENTS

| CN | 107104124 A | 8/2017 |
| CN | 107644947 A | 1/2018 |

(Continued)

*Primary Examiner* — Caridad Everhart

(57) ABSTRACT

The invention relates to an organic light-emitting diode (OLED) display device and a manufacturing method thereof. In the invention, a first retaining wall corresponding to a bending region is configured to include first retaining wall units spaced apart from each other, and a first buffer structure is formed in a gap provided between the first retaining wall units and is alternately connected to a left side and a right side of the first retaining wall units. This can prevent excessive stress concentration on the retaining wall in the bending region due to its special configuration, which causes a phenomenon of film layer detachment. Therefore, a failure of the OLED display device is prevented.

8 Claims, 3 Drawing Sheets

(56) References Cited

U.S. PATENT DOCUMENTS

2018/0069195 A1     3/2018   Furue
2018/0097198 A1     4/2018   Chou et al.
2019/0326375 A1*   10/2019   Ochi .................... H01L 51/5253
2020/0075692 A1*   3/2020   Park .................... H01L 51/5253

FOREIGN PATENT DOCUMENTS

CN       107887405 A    4/2018
CN       208127245 U    11/2018

\* cited by examiner

ORGANIC LIGHT-EMITTING DIODE DISPLAY DEVICE AND MANUFACTURING METHOD THEREOF

FIELD OF INVENTION

The present invention relates to the field of display technologies, and in particular, to an OLED display device and a manufacturing method thereof.

BACKGROUND OF INVENTION

Organic light-emitting diode (OLED) display devices are also known as organic electroluminescent display devices and organic light-emitting semiconductors. A working principle of OLED is: when electric power is supplied up to an appropriate voltage, an anode hole and a cathode charge will be combined in a light-emitting layer. Under action of Coulomb force, they will recombine to form excitons (electron-hole pairs) of an excited state. This excited state is unstable under an ordinary environment. Excitons in the excited state are recombined and transmit energy to a luminescent material, such that they transit from an energy level of a ground state to that of the excited state. Excited-state energy generates photons by a radiation relaxation process and releases light energy. Three primary colors of red, green, and blue (RGB) are produced according to their formulations to form basic colors.

OLED has advantages of low voltage demand, high power-saving efficiency, fast response times, light weight, thinness, simple structure, low cost, wide viewing angles, almost infinitely high contrast, low power consumption, extremely high response speed, etc. It has become one of the most important display technologies.

However, OLED devices are particularly sensitive to water and oxygen. Metal electrodes and organic light-emitting material are prone to aging when in contact with water and oxygen. In order to prevent devices from being damaged, it is necessary to encapsulate the metal electrodes and the light-emitting material to protect them. A traditional encapsulating method is rigid encapsulation, but the devices cannot be bent after rigid encapsulation is performed. In order to achieve a purpose of flexible display, a thin-film encapsulation (TFE) method is currently widely adopted. That is, encapsulation is performed by a manner of overlapping multilayer inorganic and organic films, wherein the inorganic layer is used to block water and oxygen, and the organic layer is used to buffer stress generated during a bending process and to encapsulate particles.

Technical Problem

The organic layer in thin-film encapsulation usually has good fluidity and its boundary is difficult to control. When it flows outside a coating region of the inorganic layer, water and oxygen can easily intrude from a side, thereby damaging the device. In order to allow the organic layer to form a film within a fixed region, a retaining wall (dam) is generally formed around a periphery of a display region to restrict a flow of the organic layer. However, due to a special configuration of the retaining wall at a bending region, stress is too concentrated, which causes a phenomenon of film layer detachment. Therefore, it is necessary to find a new type of OLED display device to solve the above problem.

SUMMARY OF INVENTION

An object of the present invention is to provide an organic light-emitting display (OLED) display device and a method of manufacturing the same. It can avoid the problem that the stress at the retaining wall of the bending region is too concentrated due to its special configuration, which causes the phenomenon of the film layer detachment.

In order to solve the above problem, an embodiment of the present invention provides an OLED display device, includes: a substrate, a functional layer, and an encapsulation layer, wherein the functional layer is disposed on the substrate; the encapsulation layer is disposed on the functional layer; wherein the functional layer is provided with a first retaining wall and a second retaining wall spaced from each other, and wherein at least one section of the first retaining wall includes first retaining wall units spaced from each other and a first buffer structure filled between the first retaining wall units.

Further, a bending region and a non-bending region are defined by the OLED display device, wherein the first retaining wall in the bending region includes the first retaining wall units spaced from each other and the first buffer structure filled between the first retaining wall units.

Further, the first buffer structure is alternately connected to a left side and a right side of the first retaining wall unit.

Further, a length of the first retaining wall unit ranges from 10 to 50 μm.

Further, a distance between the first retaining wall units ranges from 10 to 50 μm.

Further, a constituent material of the first buffer structure includes one or more of an acrylic organic material and an epoxy resin organic material.

Further, the second retaining wall in the bending region includes second retaining wall units spaced from each other and a second buffer structure filled between the second retaining wall units.

Further, the encapsulation layer includes a first inorganic layer, an organic layer, and a second inorganic layer. The first inorganic layer is disposed on the functional layer, and an outer edge of the first inorganic layer is disposed on a side of the second retaining wall away from the first retaining wall. The organic layer is disposed on the first inorganic layer, and an outer edge of the organic layer is disposed on a side of the second retaining wall toward the first retaining wall. The second inorganic layer is disposed on the organic layer, and an outer edge of the second inorganic layer is disposed on a side of the outer edge of the first inorganic layer away from the second retaining wall.

Another embodiment of the present invention further provides a method of manufacturing an OLED display device according to the present invention, includes the following steps: Step S1, providing a substrate, and forming a functional layer on the substrate; and Step S2, forming an encapsulation layer on the functional layer. The Step S1 includes forming a first retaining wall and a second retaining wall spaced from each other on the substrate; configuring at least a section of the first retaining wall to first retaining wall units spaced from each other, and filling a first buffer structure between the first retaining wall units adjacent to each other.

Further, the first buffer structure is filled between the first retaining wall units adjacent to each other by an inkjet printing technology.

Beneficial Effect

The present invention relates to an organic light-emitting diode (OLED) display device and a method of manufacturing the same. In the present invention, the first retaining wall corresponding to the bending region is configured to include first retaining wall units spaced apart from each other, and a first buffer structure is formed in a gap provided between the first retaining wall units and is alternately connected to a left side and a right side of the first retaining wall units. The first retaining wall can achieve an effect of preventing the organic layer from overflowing during a printing process, Moreover, the stress generated during the bending of the OLED display device can be dispersed by the first buffer structure having elasticity. Therefore, excessive concentration of stress due to the special configuration of the retaining wall in the bending area, which causes the phenomenon of film layer detachment, can be prevented, thereby preventing the failure of the OLED display device.

DESCRIPTION OF DRAWINGS

In order to explain the technical solution in the embodiments of the present invention more clearly, the drawings used in the description of the embodiments will be briefly introduced below. Obviously, the drawings in the following description are only some embodiments of the present invention. For those skilled in the art, other drawings can be obtained according to these drawings without creative efforts.

Figure 1:
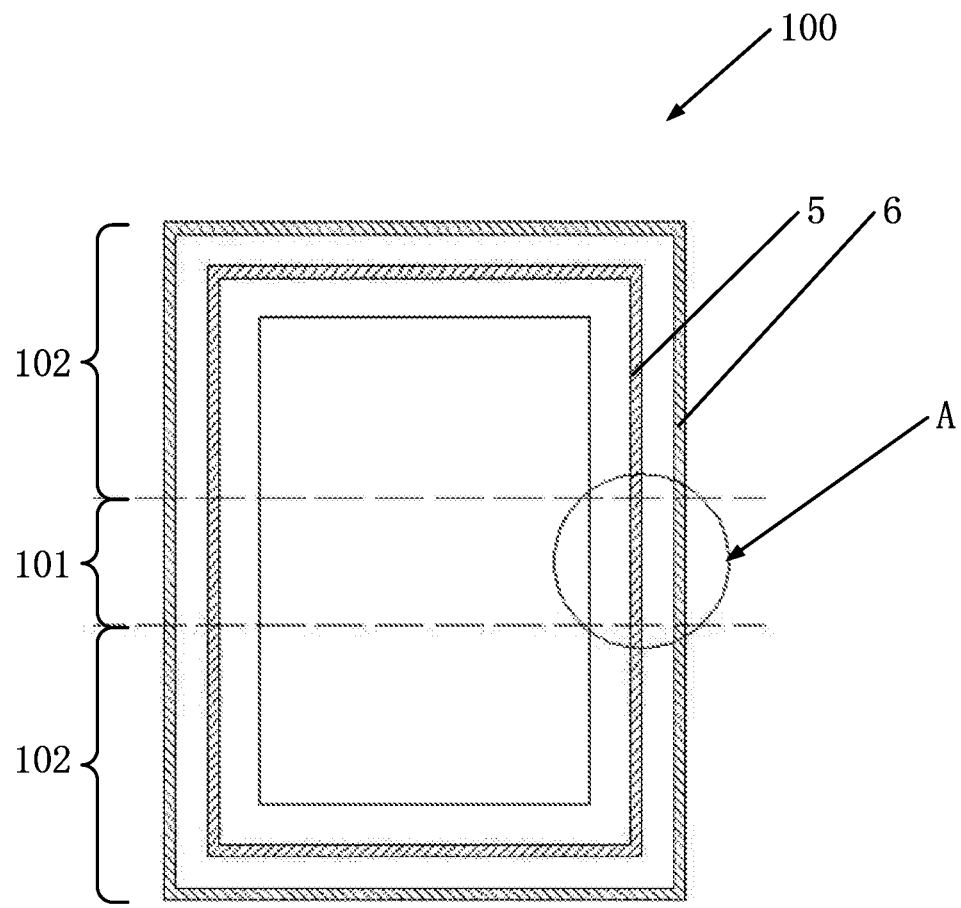
FIG. 1 is a schematic plan view of an OLED display device according to the present invention.

The components in the drawings are denoted as follows: 100, OLED display device; 101, bending region; 102, non-bending region; 1, substrate; 2, encapsulation layer; 3, planarization layer; 4, pixel definition layer; 5, first retaining wall; 6, second retaining wall; 21, first inorganic layer; 22, organic layer; 23, second inorganic layer; 51, first retaining wall unit; 52, first buffer structure; 61, second retaining wall unit; 62, second buffer structure.

DETAILED DESCRIPTION OF PREFERRED EMBODIMENTS

The preferred embodiments of the present invention will be described in detail below with reference to the accompanying drawings in order to completely introduce the technical content of the present invention to those skilled in the art. An embodiment is used to prove that the present invention can be implemented, so that the technical content disclosed by the present invention is clear, and it is easier for those skilled in the art to understand how to implement the present invention. However, the present invention can be embodied in many different forms of embodiments, and the protection scope of the present invention is not limited to the embodiments mentioned herein, and the description of the following embodiments is not intended to limit the scope of the present invention.

The directional terms mentioned in the present invention, such as "above", "below", "front", "rear", "left", "right", "inside", "outside", "side", etc. are only the directions in the drawings and used to explain and illustrate the present invention, but not to limit the protection scope of the present invention.

In the drawings, components having the same structure are denoted by the same numerals, and components having similar structures or functions are denoted by similar numerals. In addition, in order to facilitate understanding and description, the size and thickness of each component shown in the drawings are arbitrarily shown, and the present invention does not limit the size and thickness of each component.

When certain components are described as "on" another component, the components can be placed directly on the other component; there can also have an intermediate component, the component is placed on the intermediate component, and the intermediate component is placed on another component. When a component is described as "mounted to" or "connected to" another component, they can be understood as directly "mounted to" or "connected to" or the component is "mounted to" or "connected to" another component by an intermediate component.

Embodiment 1

As shown in FIG. 1, an OLED display device 100 includes a bending region 101 and a non-bending region 102.

Figure 2:
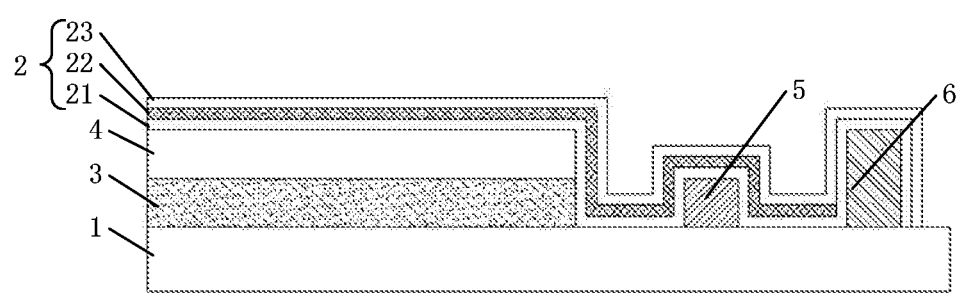
FIG. 2 is a schematic sectional view at a circle A in FIG. 1

As shown in FIG. 2, the OLED display device 100 includes a substrate 1, a functional layer, and an encapsulation layer 2.

Figure 3:
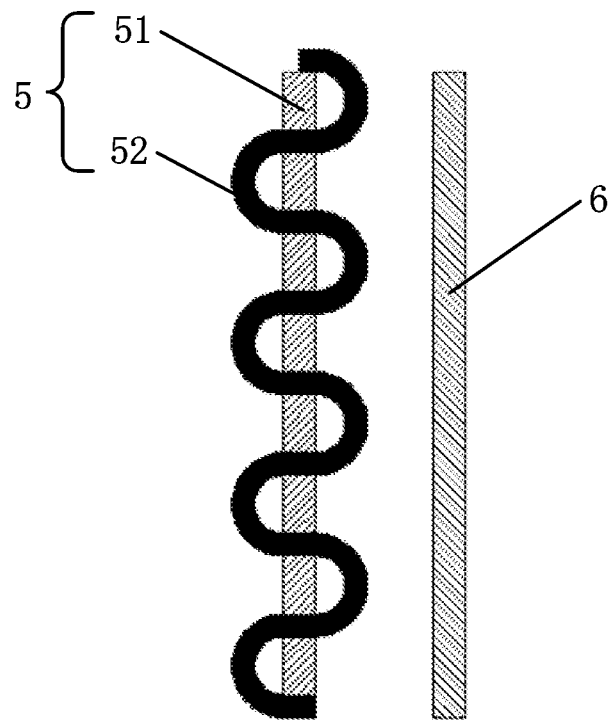
FIG. 3 is an enlarged schematic view of embodiment 1 at the circle A in FIG. 1.

As shown in FIG. 1, FIG. 2, and FIG. 3, the functional layer is disposed on the substrate 1.

The functional layer includes a planarization layer 3 disposed on the substrate 1 and a pixel definition layer 4 disposed on the planarization layer 3. In fact, the functional layer further includes an active layer, a gate insulating layer, a gate layer, an interlayer insulating layer, a source-drain layer, and the like, and details are not described herein. The functional layer is further provided with a first retaining wall 5 and a second retaining wall 6 spaced from each other; wherein at least one section of the first retaining wall 5 includes first retaining wall units 51 spaced from each other and a first buffer structure 52 filled between the first retaining wall units 51. The first buffer structure 52 is alternately connected to a left side and a right side of the first retaining wall units 51.

As shown in FIG. 2 and FIG. 3, the first retaining wall 5 of the bending region 101 in the embodiment includes the first retaining wall units 51 disposed at intervals from each other and first buffer structure 52 filled between the first retaining wall units 51. The first buffer structure 52 is further alternately connected to the left side and the right side of the first retaining wall units 51. In the embodiment, a shape of the first buffer structure 52 is similar to a wavy curve, and it can also be provided in a zigzag shape, a rectangular shape, or the like in an actual implementation. The shape of the first buffer structure 52 in the embodiment is preferably a wavy curve, which mainly disperses the stress generated during bending of the OLED display device 100 along the curve to prevent the phenomenon of stress concentration, and ultimately preventing the phenomenon of film layer detachment and thereby preventing the failure of the OLED display device 100.

A length of the first retaining wall units 51 ranges from 10 to 50 jam, and an interval between the first retaining wall units 51 ranges from 10 to 50 μm. When a distance between the first retaining wall units 51 is less than 10 μm, an effect of dispersing the stress that is generated during the bending of the OLED display device 100 is not obvious. In addition, an excessively short distance will increase production difficulty and eventually lead to an increase in production cost. When the distance between the first retaining wall units 51 is greater than 50 µm, an effect of the first retaining wall units 51 as a barrier to prevent the organic layer material from overflowing will be affected. Therefore, in the embodiment, the length of the first retaining wall units 51 is preferably 30 µm, and the distance between adjacent first retaining wall units 51 is 30 µm.

The distance between the second retaining wall 6 and the first retaining wall 5 ranges from 30 to 40 µm. Thus, the effect of preventing the material of an organic layer 22 from overflowing can be well achieved.

A constituent material of the first buffer structure 52 includes one or more of acrylic organic material and epoxy resin organic material. The first buffer structure 52 formed from these materials has good elasticity and can disperse the stress generated during bending of the OLED display device 100. The phenomenon of stress concentration is prevented, and finally, the phenomenon of film layer detachment is prevented, thereby preventing the failure of the OLED display device 100.

As shown in FIG. 2, the encapsulation layer 2 is disposed on the functional layer. Specifically, the encapsulation layer 2 includes a first inorganic layer 21, the organic layer 22, and a second inorganic layer 23. The first inorganic layer 21 is disposed on the functional layer, and an outer edge of the first inorganic layer 21 is disposed on a side of the second retaining wall 6 away from the first retaining wall 5. Thus, the first retaining wall 5 and the second retaining wall 6 are completely encapsulated, which can achieve an effect of blocking water and oxygen, and prevent the OLED display device 100 from damage.

As shown in FIG. 2, the organic layer 22 is disposed on the first inorganic layer 21, and an outer edge of the organic layer 22 is disposed on a side of the second retaining wall 6 toward the first retaining wall 5. In the embodiment, a boundary of the organic layer 22 is disposed between the first retaining wall 5 and the second retaining wall 6. In a specific implementation, the boundary of the organic layer 22 can be disposed on a side of the first retaining wall 5 away from the second retaining wall 6. This can prevent the phenomenon that the constituent materials of the organic layer 22 overflow and further cause the device to fail.

As shown in FIG. 2, the second inorganic layer 23 is disposed on the organic layer 22, and an outer edge of the second inorganic layer 23 is disposed on a side of an outer edge of the first inorganic layer 21 away from the second retaining wall 6. Therefore, the first inorganic layer 21 underneath is also completely encapsulated, and the effect of blocking water and oxygen can be better realized.

The first inorganic layer 21 and the second inorganic layer 23 can be formed by method of one or more of atomic layer deposition, pulsed laser deposition, sputtering, and vapor deposition.

The organic layer 22 can be formed by method of one or more of inkjet printing and dispensing techniques.

Embodiment 2

Figure 4:
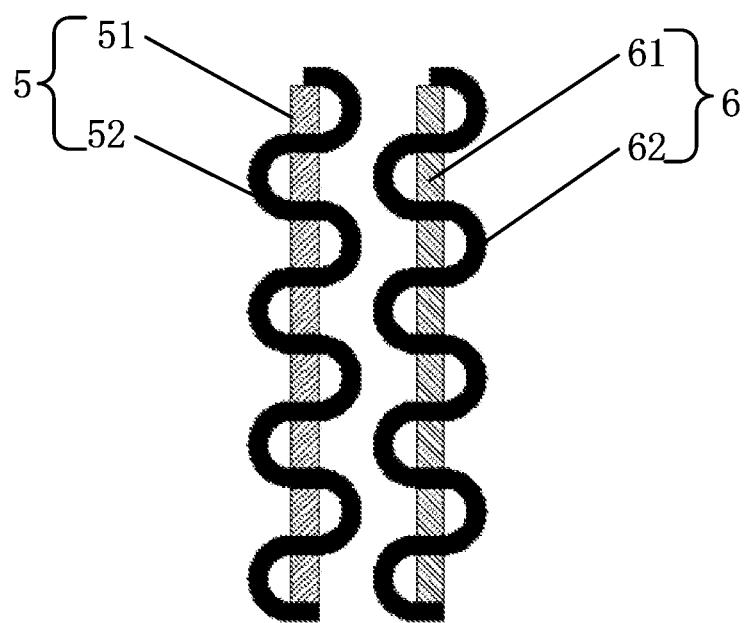
FIG. 4 is an enlarged schematic view of embodiment 2 at the circle A in FIG. 1.

As shown in FIG. 1, FIG. 3, and FIG. 4, the embodiment differs from embodiment 1 in that:

The second retaining wall 6 corresponding to the bending region 101 in the embodiment includes: second retaining wall units 61 and a second buffer structure 62. Wherein, the second retaining wall units 61 are spaced from each other; the second buffer structure 62 is disposed in a gap between the second retaining wall units 61 and is alternately connected to a left side and a right side of the second retaining wall units 61. In the embodiment, a shape of the second buffer structure 62 is similar to a wavy curve, and it can also be provided in a zigzag shape, a rectangular shape, or the like in an actual implementation. The shape of the second buffer structure 62 in the embodiment is preferably a wavy curve, which mainly disperses the stress generated during bending of the OLED display device 100 along the curve, which prevents the phenomenon of stress concentration, and finally prevents the phenomenon of film layer detachment, thereby preventing the failure of the OLED display device 100.

Embodiment 3

Figure 5:
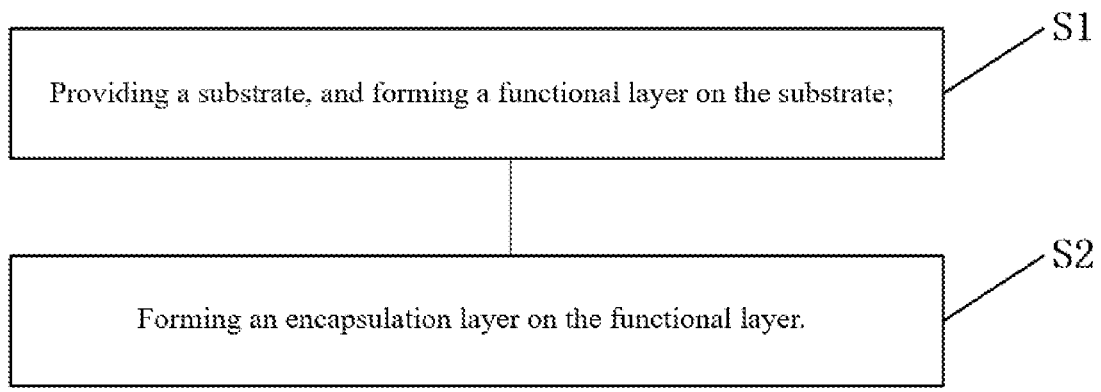
FIG. 5 is a manufacturing process diagram of the OLED display device of the present invention.

As shown in FIG. 5, the embodiment provides a method of manufacturing an organic light-emitting diode (OLED) display device 100 according to the present invention, which includes following steps: Step S1, providing a substrate 1, and forming a functional layer on the substrate 1; Step S2, forming an encapsulation layer 2 on the functional layer.

Step S1 includes forming a planarization layer 3 on the substrate 1 and forming a pixel definition layer 4 on the planarization layer 3.

Wherein, the first retaining wall 5 is formed by etching the planarization layer 3 at a position where the first retaining wall 5 is to be formed after the planarization layer 3 is formed and retaining the pixel definition layer 4 formed at the position in a subsequent process.

Wherein, the second retaining wall 6 is formed by retaining the planarization layer 3 at a position where the second retaining wall 6 is to be formed after the planarization layer 3 is formed and then stacking the pixel definition layer 4 thereon in a subsequent process.

Wherein, step S1 further includes configuring at least a section of the first retaining wall 5 to first retaining wall units 51 spaced from each other and filling a first buffer structure 52 between the first retaining wall units 51 adjacent to each other.

Specifically, the OLED display device 100 to be manufactured is defined with a bending region 101 and a non-bending region 102, wherein the first retaining wall units 51 and the first buffer structure 52 are disposed in the bending region 101. The first buffer structure 52 is filled between the adjacent first retaining wall units 51 by inkjet printing technique. A width of the inkjet printing of the first buffer structure 52 is less than a distance between the adjacent first retaining wall units 51. In this way, a material of the first buffer structure 52 can be prevented from being printed on the first retaining wall units 51 during the inkjet printing process to cause abnormal encapsulation and affect the encapsulation effect.

The OLED display device 100 formed by the above method can achieve the effect of preventing the organic layer 22 from overflowing during the printing process. In addition, the stress generated during bending of the OLED display device 100 can be dispersed by the first buffer structure 52 having elasticity. This can prevent excessive stress concentration on the retaining wall in the bending region 101 due to its special configuration, which causes the phenomenon of film layer detachment. Therefore, the failure of the OLED display device 100 is prevented.

The OLED display device and the manufacturing method thereof provided by the present invention have been described in detail above. It should be understood that the exemplary embodiments described herein should only be considered as descriptive, used to help understand the method of the present invention and its core ideas, but not to limit the present invention. Descriptions of features or aspects in each exemplary embodiment should be considered as applicable to similar features or aspects in other exemplary embodiments. Although the present invention has been described with reference to exemplary embodiments, various changes and modifications may be suggested to those skilled in the art. The invention is intended to cover such changes and modifications within the scope of the claims. Any modification, equivalent replacement, and improvement made within the spirit and principle of the present invention shall be included in the protection scope of the present invention.

What is claimed is:

1. An organic light-emitting diode (OLED) display device defined with a bending region and a non-bending region, comprising:
    a substrate;
    a functional layer disposed on the substrate;
    an encapsulation layer disposed on the functional layer and the substrate; and
    a first retaining wall and a second retaining wall spaced from each other provided on a periphery of the substrate;
    wherein at least a section of the first retaining wall in the bending region comprises first retaining wall units spaced from each other and a first buffer structure that alternately penetrates gaps between the first retaining wall units from a left side and a right side of the first retaining wall units.

2. The OLED display device according to claim 1, wherein a length of the first retaining wall units ranges from 10 to 50 μm.

3. The OLED display device according to claim 1, wherein a distance between the first retaining wall units ranges from 10 to 50 μm.

4. The OLED display device according to claim 1, wherein a constituent material of the first buffer structure comprises one or more of an acrylic organic material and an epoxy resin organic material.

5. The OLED display device according to claim 1, wherein the second retaining wall in the bending region comprises second retaining wall units spaced from each other and a second buffer structure that alternately penetrates gaps between the second retaining wall units from a left side and a right side of the second retaining wall units.

6. The OLED display device according to claim 1, wherein the encapsulation layer comprises:
    a first inorganic layer disposed on the functional layer, and an outer edge of the first inorganic layer disposed on a side of the second retaining wall away from the first retaining wall;
    an organic layer disposed on the first inorganic layer, and an outer edge of the organic layer disposed on a side of the second retaining wall toward the first retaining wall; and
    a second inorganic layer disposed on the organic layer, and an outer edge of the second inorganic layer disposed on a side of an outer edge of the first inorganic layer away from the second retaining wall.

7. A method of manufacturing the OLED display device according to claim 1, comprising following steps:
    Step S1, providing a substrate, and forming a functional layer on the substrate;
    Step S2, forming an encapsulation layer on the functional layer;
    wherein the Step S1 comprises forming a first retaining wall and a second retaining wall spaced from each other on a periphery of the substrate; and
    configuring at least a section of the first retaining wall to comprise first retaining wall units spaced from each other, and forming a first buffer structure that alternately penetrates gaps between the first retaining wall units from a left side and a right side of the first retaining wall units.

8. The method of manufacturing the OLED display device according to claim 7, wherein the first buffer structure is formed by an inkjet printing technique.

* * * * *